United States Patent
Takano et al.

(10) Patent No.: US 11,462,261 B2
(45) Date of Patent: Oct. 4, 2022

(54) METHODS OF ACTIVATING INPUT/OUTPUT LINES OF MEMORY DEVICES, AND RELATED DEVICES AND SYSTEMS

(71) Applicant: Micron Technology, Inc., Boise, ID (US)

(72) Inventors: Yosuke Takano, Tokyo (JP); Atsushi Shimizu, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/598,938

(22) Filed: Oct. 10, 2019

(65) Prior Publication Data
US 2021/0110864 A1 Apr. 15, 2021

(51) Int. Cl.
G11C 11/4096 (2006.01)
G11C 7/10 (2006.01)
G11C 11/4076 (2006.01)
G11C 11/4091 (2006.01)

(52) U.S. Cl.
CPC .......... G11C 11/4096 (2013.01); G11C 7/10 (2013.01); G11C 11/4076 (2013.01); G11C 11/4091 (2013.01)

(58) Field of Classification Search
CPC .......... G11C 11/4096; G11C 11/4076; G11C 11/4091; G11C 7/18
See application file for complete search history.

(56) References Cited

U.S. PATENT DOCUMENTS

| | | | |
|---|---|---|---|
| 2001/0019512 A1* | 9/2001 | Hidaka | G11C 7/18 365/230.03 |
| 2005/0105363 A1* | 5/2005 | Ko | G11C 11/4082 365/222 |
| 2005/0144373 A1* | 6/2005 | Kirihata | G06F 13/1694 711/105 |
| 2006/0126421 A1* | 6/2006 | Hwang | G11C 7/22 365/230.06 |
| 2009/0003106 A1* | 1/2009 | Lee | G11C 7/12 365/203 |
| 2015/0120097 A1 | 4/2015 | Mitsubori et al. | |
| 2015/0120997 A1 | 4/2015 | Mitsubori et al. | |
| 2015/0121109 A1* | 4/2015 | Seo | G05F 1/577 713/323 |
| 2016/0372166 A1* | 12/2016 | Lym | G11C 7/1051 |
| 2017/0110174 A1 | 4/2017 | Fujisawa | |
| 2018/0315457 A1 | 11/2018 | Nishizaki | |

* cited by examiner

Primary Examiner — Sultana Begum
(74) Attorney, Agent, or Firm — TraskBritt

(57) ABSTRACT

A method of operating a memory device is disclosed. A method may include generating a first control signal to activate a first number of main input/output (MIO) lines associated with a first data terminal region of a memory bank at a first time. The method may also include generating a second control signal to activate a second number of MIO lines associated with a second data terminal region of the memory bank at a second, subsequent time. Further, the method may include resetting each of the first control signal and the second control signal in response to a command.

18 Claims, 10 Drawing Sheets

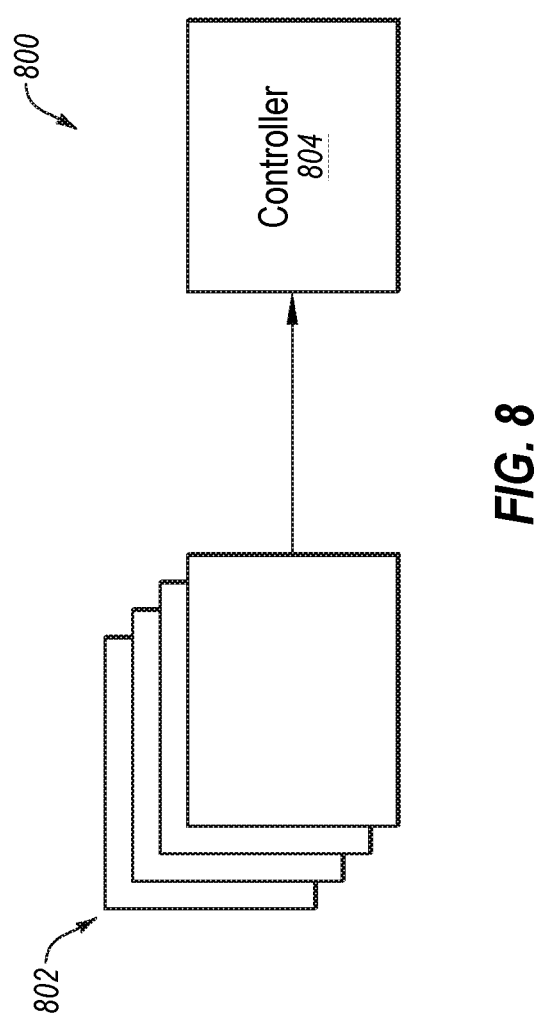

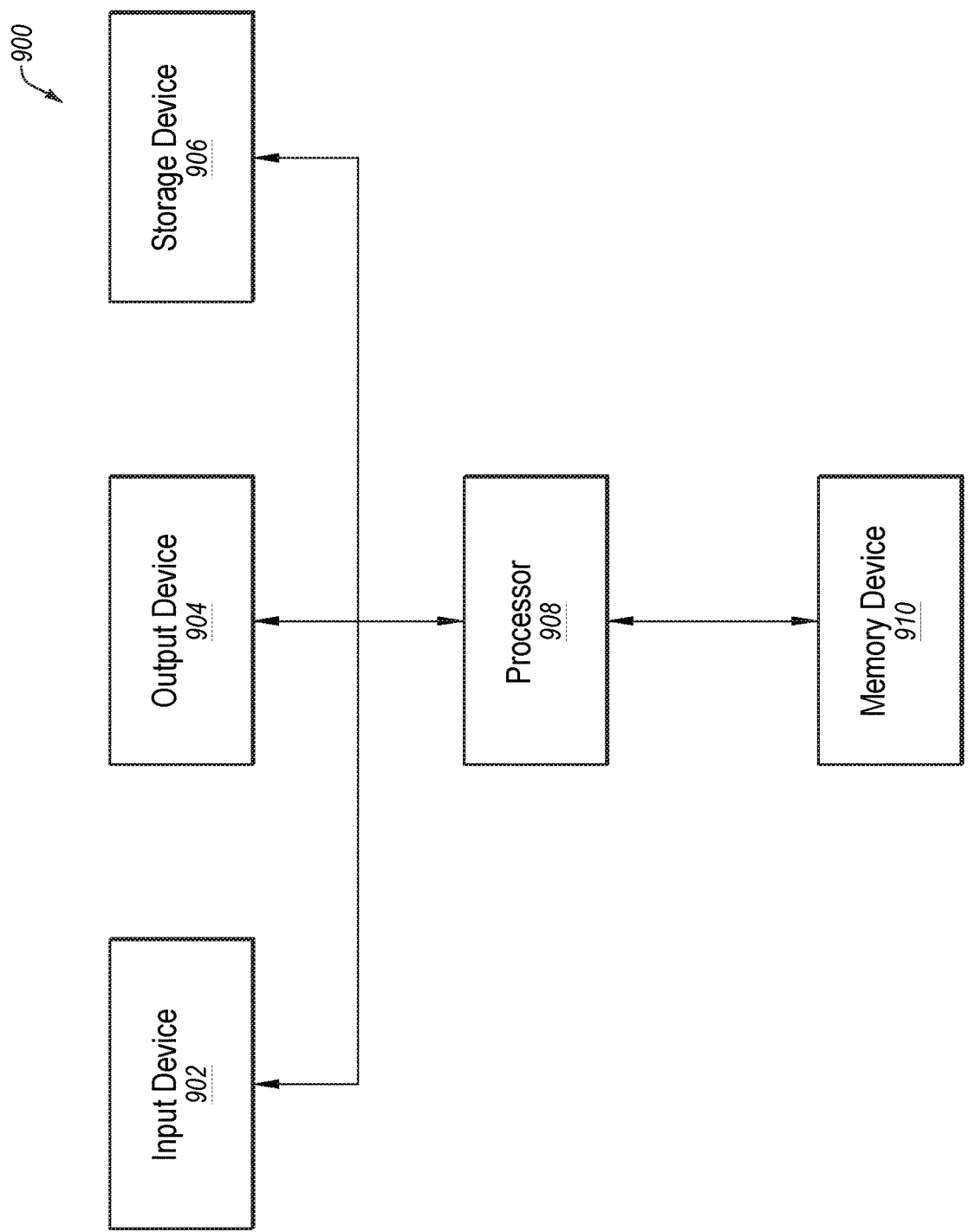

METHODS OF ACTIVATING INPUT/OUTPUT LINES OF MEMORY DEVICES, AND RELATED DEVICES AND SYSTEMS

TECHNICAL FIELD

Embodiments of the disclosure relate to activating input/output lines of a memory device. More specifically, various embodiments relate to activating a number of main input/output lines of a memory device via a number of control signals, and to related methods, devices, and systems.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory.

Memory devices typically include many memory cells, arranged in a memory array, and capable of holding a charge that is representative of a bit of data. Data may be written to or retrieved from a memory cell via input/output lines, such a local input/output lines (LIO) and main input/output (MIO) lines.

BRIEF DESCRIPTION OF THE DRAWINGS

FIG. 8 is a simplified block diagram of a memory device, in accordance with various embodiments of the present disclosure.

FIG. 9 is a simplified block diagram of an electronic system, in accordance with various embodiments of the present disclosure.

DETAILED DESCRIPTION

Various embodiments described herein relate to activating main input/output (MIO) lines of an apparatus (e.g., a memory device). More specifically, various embodiments relate to generating control signals (also referred to herein as "timing signals") for activing a first main input/output (MIO) of a memory bank of a memory device, and subsequently activating a second MIO of the memory bank. Yet more specifically, various embodiments relate to generating a first control signal for activing, at a first time, a number of MIO lines for a first data terminal region (e.g., an upper data terminal region) of a memory bank of a memory device, and generating a second control signal for activing, at a second, subsequent time, a number of MIO lines for a second data terminal region (e.g., a lower data terminal region) of the memory bank.

Figure 1:
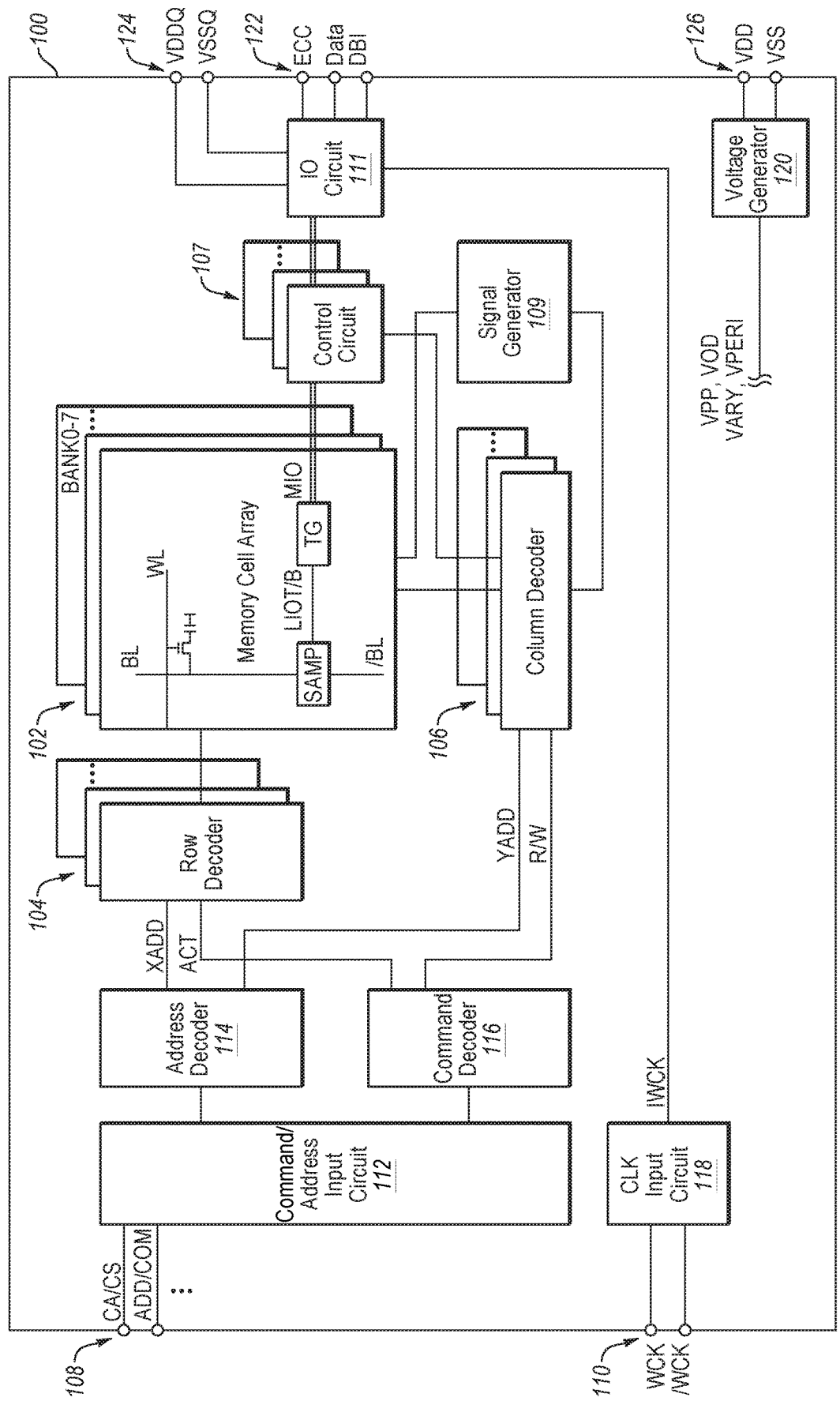
FIG. 1 is a block diagram of an example memory device, according to various embodiments of the present disclosure.

FIG. 1 includes a block diagram of an example memory device 100, according to various embodiments of the present disclosure. Memory device 100 may include, for example, a DRAM (dynamic random access memory), a SRAM (static random access memory), a SDRAM (synchronous dynamic random access memory), a DDR SDRAM (double data rate DRAM, such as a DDR4 SDRAM and the like), or a SGRAM (synchronous graphics random access memory). Memory device 100, which may be integrated on a semiconductor chip, may include a memory array 102.

In the embodiment of FIG. 1, memory array 102 is shown as including eight memory banks BANK0-7. More or fewer banks may be included in memory array 102 of other embodiments. Each memory bank includes a number of access lines (word lines WL), a number of data lines (bit lines BL and /BL), and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or /BL may be amplified by sense amplifier SAMP, and transferred over complementary local input/output lines (LIOT/B), a transfer gate TG, and complementary main input/output lines (MIOT/B). Conversely, write data may be transferred to sense amplifier SAMP over complementary main input/output lines MIOT/B, transfer gate TG, and complementary local input/output lines LIOT/B, and written in memory cell MC coupled to bit line BL or /BL.

Memory device 100 may be generally configured to be receive various inputs (e.g., from an external controller) via various terminals, such as command and address terminals 108, clock terminals 110, and data and data mask terminals 122. Memory device 100 may include additional terminals such as power supply terminals 124 and 126.

During a contemplated operation, one or more command signals, received via command and address terminals 108, may be conveyed to a command decoder 116 via a command/address input circuit 112. Command decoder 116 may include a circuit configured to generate various internal commands via decoding one or more command signals COM. Examples of the internal commands include an active command ACT and a read/write signal R/W.

Further, one or more address signals ADD, received via command and address terminals 108, may be conveyed to an address decoder 114 via command and address input circuit 112. Address decoder 114 may be configured to supply a row address XADD to row decoder 104 and a column address YADD to column decoder 106.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and the bit line BL specified by column address YADD may be selected.

In response to active command ACT, a read signal, a row address XADD, and a column address YADD, data may be read from memory cell MC specified by row address XADD and column address YADD. The read data may be output via a sense amplifier SAMP, transfer gate TG, a control circuit 107, an input/output circuit 111, and data terminal 122. Further, in response to active command ACT, a write signal, a row address XADD, and a column address YADD, write data may be supplied to memory array 102 via data terminal 122, input/output circuit 111, control circuit 107, transfer gate TG, and sense amplifier SAMP. The write data may be written to memory cell MC specified by row address XADD and column address YADD.

According to some embodiments, a signal generator 109 may receive one or more signals (e.g., one or more signals responsive to a read/write signal R/W (e.g., a READ command) or a precharge (PRE) command) from column decoder 106 and generate one or more timing signals that may be conveyed to memory array 102 and or control circuit 107. More specifically, as described more fully below, in response to one or more received signals, signal generator 109 may generate one or more timing signals that may be conveyed to sense amplifier SAMP, transfer gate TG, and/or control circuit 107.

Clock signals CK and /CK may be received via clock terminals 110. A clock input circuit 118 may generate internal clock signals IWCK based on clock signals WCK and /WCK. Internal clock signals IWCK may be conveyed to various components of memory device 100. For example, internal clock signals IWCK may be conveyed to input/output circuit 111 (e.g., for controlling the operation timing of input/output circuit 111).

Figure 2:
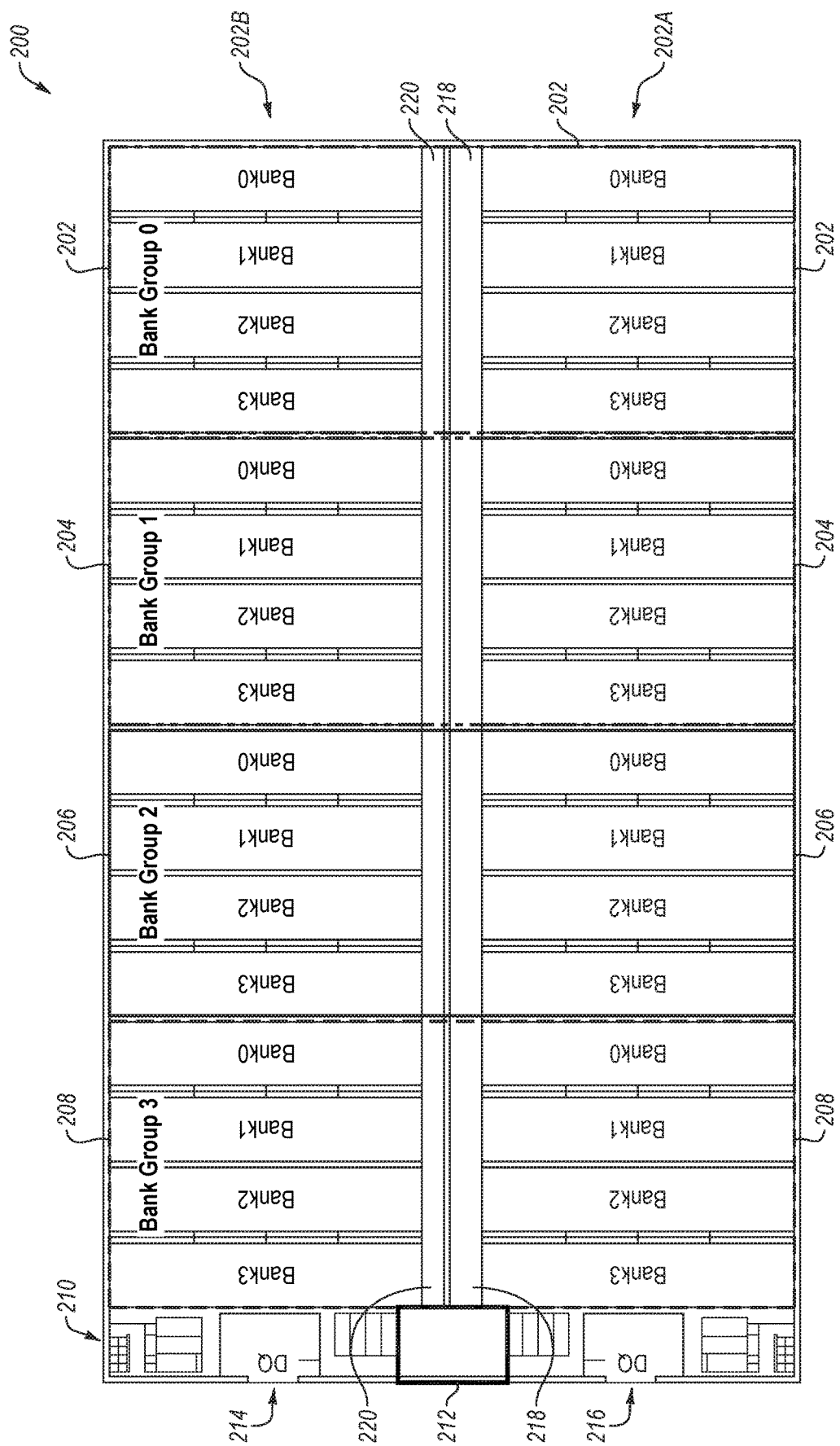
FIG. 2 is another depiction of an example memory device including a number of memory bank groups, according to various embodiments of the present disclosure.

FIG. 2 illustrates a memory device 200, according to various embodiments of the present disclosure. Memory device 200, which may include, for example, a DRAM, includes a number of memory bank groups (i.e., bank group 202 ("Bank Group 0"), bank group 204 ("Bank Group 1"), bank group 206 ("Bank Group 2"), and bank group 208 ("Bank Group 3")), wherein each bank group includes a number of banks (e.g., Bank0, Bank1, Bank2, and Bank3). According to various embodiments, each bank shown in FIG. 2 may include two partial banks (e.g., "half banks" or "portions") that are arranged in regions (e.g., upper and lower regions) of an associated bank group. More specifically, for example, bank group 202 incudes a region 202A and a region 202B. In the illustrated example, region 202A may include a lower region, and region 202B may include an upper region. Thus, for example, Bank0 of Bank Group 0 includes a portion within region 202A and a portion within region 202B. Similarly, as another example, Bank2 of Bank Group 3 includes a portion within region 202A and a portion within region 202B.

Memory device 200 further includes control circuitry 210, which may include, for example, command/address/control circuits. Also, memory device 200 includes command/address (CA) area 212 including one or more CA pads (not shown in FIG. 2). Memory device 200 also includes DQ pads 214 and 216. Further, according to various embodiments, a first portion of each memory bank (e.g., within region 202A) may be coupled to a first number of DQ pads (e.g., lower DQ pads 216, such as DQ pads 0-7), and a second portion of each memory bank (e.g., within region 202B) may be coupled to a second number of DQ pads (e.g., upper DQ pads 214, such as DQ pads 8-15).

Memory device 200 further includes other circuits, such as digital sense amplifier (DSA) 218 and logic (e.g., row bank logic) 220. For example, banks within one or more bank groups may share circuitry, such as DSA 218, logic 220, and/or error correction code (ECC) circuitry (not shown in FIG. 2).

Figure 3A:
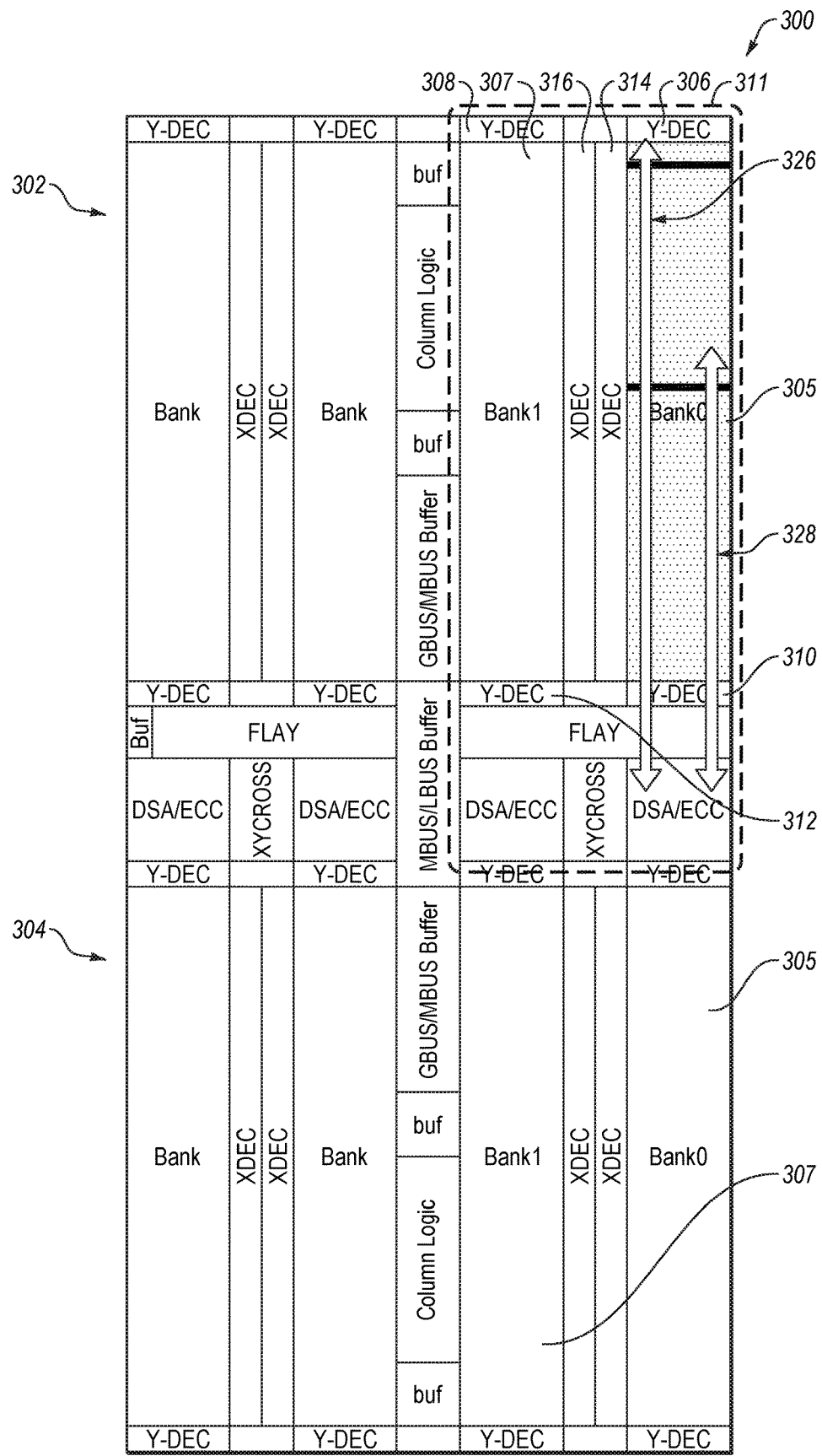
FIG. 3A depicts a portion of an example memory device including a number of bank regions, in accordance with various embodiments of the present disclosure.

FIG. 3A depicts a portion of a memory device 300, in accordance with various embodiments of the present disclosure. Memory device 300 includes a first (e.g., upper) bank region 302 and a second (e.g., lower) bank region 304. Each of first bank region 302 and bank region 304 include a portion of a first bank (i.e., Bank0) 305 and a portion of a second bank (i.e., Bank1) 307. A portion 311 of memory device 300 that includes region 302 of banks 305 and 307 is shown in FIG. 3B.

Figure 3C:
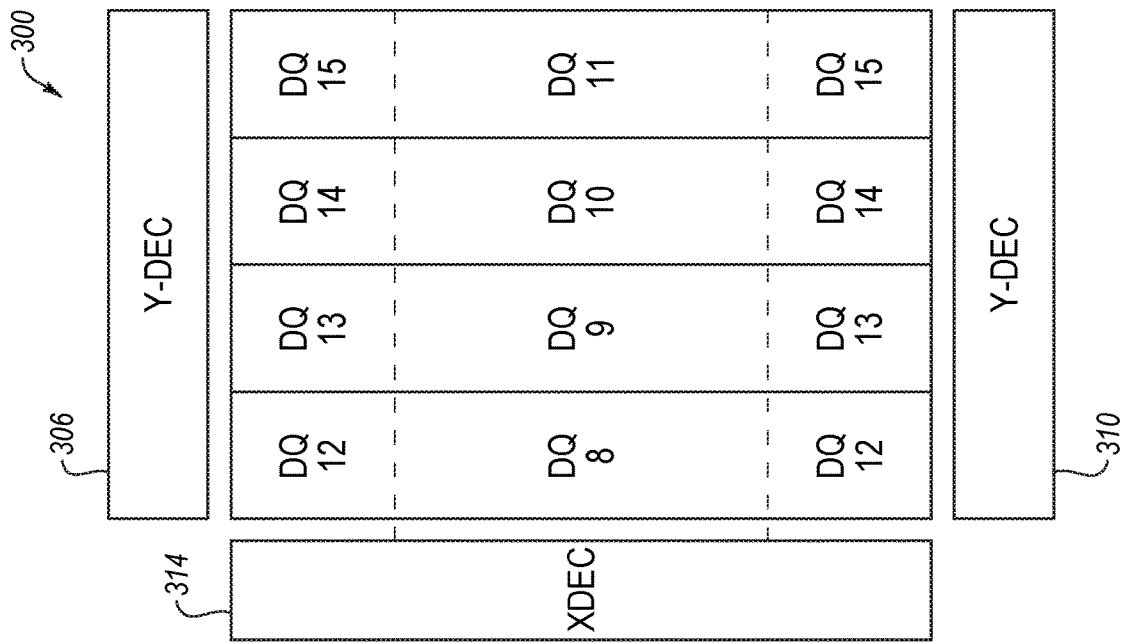
FIG. 3C is another illustration of an example memory device including a number of data terminals of a number of data terminal regions, in accordance with various embodiments of the present disclosure.
Figure 3B:
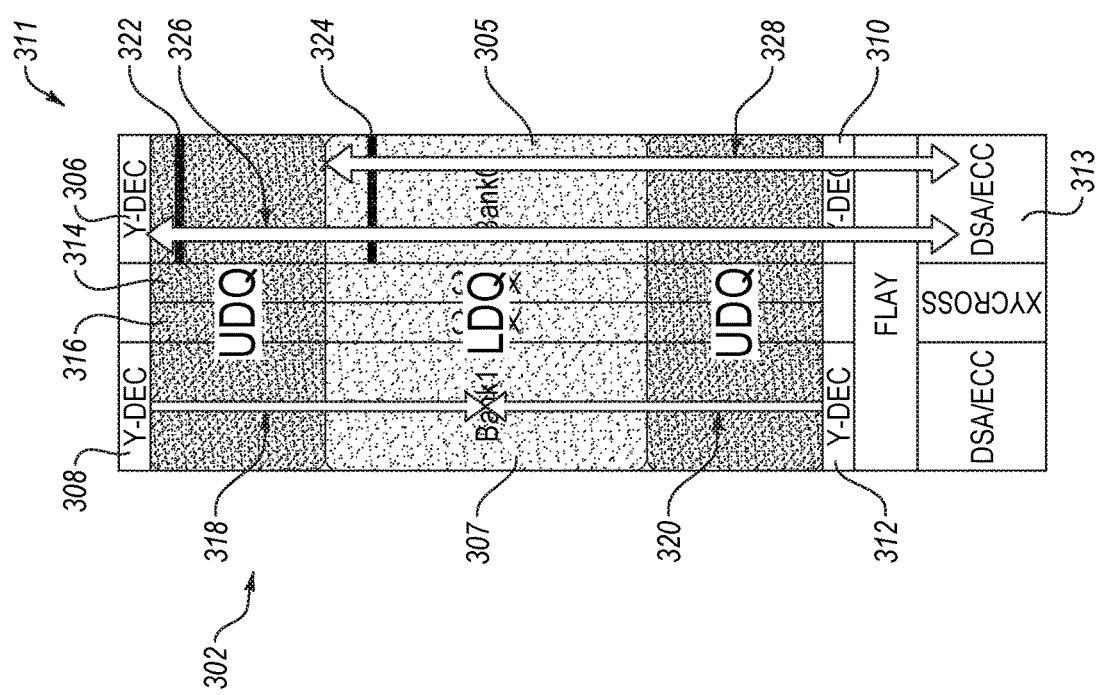
FIG. 3B illustrates a region of an example memory device, according to various embodiments of the present disclosure.

As shown in FIGS. 3A and 3B, memory device 300 includes column decoders ("Y-DEC") 306, 308, 310, and 312 configured to drive a column select (CS) signal from the upper and lower regions. Although in some embodiments, one column decoder may be used, in other embodiments, more than one column decoder (e.g., two column decoders) may be used (e.g., to drive a relatively large load). Further, memory device 300 includes row decoders 314 and 316 positioned between first bank 305 and second bank 307.

FIG. 3B further illustrates column selection lines 318 and 320 and selected word lines 322 and 324 (e.g., selected responsive to row addresses). Further, as illustrated in FIG. 3B, memory device 300 includes a data terminal region UDQ and a data terminal region LDQ. For example, data terminal region UDQ may also be referred to herein as an "upper data terminal region," and data terminal region LDQ may also be referred to herein as a "lower data terminal region."

FIG. 3C is another illustration of memory device 300 including a number of data terminals (DQ) of a number of DQ regions. FIG. 3C further depicts column decoders 306 and 310, and row decoder 314. As shown in FIG. 3C, memory device 300 includes DQ areas 8-15, wherein each DQ area is associated with a DQ. For example, data transferred to/from a DQ X (e.g., DQ 12; not shown in FIG. 3C) may be stored in DQ X area(s) (e.g., DQ 12 areas shown in FIG. 3C). Further, according to some embodiments, DQ areas 8-11 are associated with a first region (e.g., data terminal region LDQ shown in FIG. 3B) and DQ areas 12-15 are associated with a second region (e.g., data terminal region UDQ shown in FIG. 3B).

It is noted that selected word line 322 is within data terminal region UDQ, and selected word line 324 is within data terminal region LDQ. Thus, in this example, each of DQ 8-15 may be accessed in one row operation. More specifically, each of DQ 8-11 may be accessible in one operation via selected word line 324, and each of DQ 12-15 may be accessible in one operation via selected word line 322.

As will be appreciated, data (e.g., a bundle of data) may be output from each DQ area via a number of associated MIO lines. More specifically, for example, for each DQ area shown in FIG. 3C, 16 bits of data may be output via 16 MIO lines. For example, in the configuration shown in FIG. 3C, a total of 128 MIO lines (i.e., 16 bits×8 DQ) may be used to transfer 128 read/write data bits. Further, in an embodiment wherein a device (e.g., memory device 300) is configured for error correction code (ECC), the device may include additional bits (e.g., parity bits).

FIG. 3B further depicts MIO 326 and MIO 328. Each of MIO 326 and MIO 328 may also be referred to herein as "a number of MIO lines." In this example, MIO 326, which is associated with data terminal region UDQ, extends from circuitry 313 through data terminal region UDQ, and MIO 328, which is associated with data terminal region LDQ, extends from circuitry 313 through data terminal region LDQ. In this embodiment, lengths of MIO 326 and 328 are not equal. More specifically, because MIO 326 extends to the uppermost portion of data terminal region UDQ, and MIO 328 extends to the uppermost portion of data terminal region LDQ, MIO 326 has a greater length than MIO 328. In other words, lines of MIO 326 are longer than lines of MIO 328. Accordingly, during operation, the parasitic capacity and resistance value ("CR") for MIO 326 may become greater than that of MIO 328.

Further, as will be appreciated, MIO lines (e.g., MIO 326 and MIO 328) may be pre-charged to a first state (e.g., a high state) and operate in a second state (e.g., a low state) in read and/or write operations. Further, in conventional devices and/or systems wherein an activation time of a first number of MIO lines (i.e., of an upper terminal region) is to be equal to an activation time of a second number of MIO lines (i.e., of a lower terminal region), the activation time is set based on the MIO lines for the upper terminal region (i.e., because the MIO lines for the upper terminal region have greater CR and therefore require a sufficient voltage to read and/or write memory cell data). Thus, in conventional devices and/or systems, because the MIO lines of the lower terminal region have a lower CR, the voltage on the MIO lines of the lower terminal region may become too large, thus an amount of power required to pre-charge the MIO lines of the lower terminal region is increased.

Various embodiments as disclosed herein may include delaying an activation of MIO lines associated with one terminal region (e.g., data terminal region LDQ) relative an activation of MIO lines associated with another terminal region (e.g., data terminal region UDQ). More specifically, for example, with reference to FIG. 3B, an activation time of MIO 328, which is associated with data terminal region LDQ, may be delayed relative to an activation time of MIO 326, which is associated with data terminal UDQ. For example, according to some embodiments, a first control signal may activate MIO 326 (e.g., via a transfer gate, such as TG of FIG. 1) of data terminal UDQ, and a second control signal, which is delayed in time relative to the first control signal, may activate MIO 326 (e.g., via a transfer gate, such as TG of FIG. 1) of data terminal LDQ. Further, according to some embodiments, each of the first control signal and the second control signal may be reset (e.g., substantially simultaneously) based on another signal (e.g., a PRE command).

As will be appreciated, by delaying an activation time of data terminal region LDQ, a voltage on the MIO lines associated with (e.g., coupled to) data terminal region LDQ may be reduced (e.g., a voltage on the MIO lines for data terminal region LDQ and a voltage on the MIO lines for data terminal region LDQ may be the same or similar), and, thus, compared to conventional methods and devices, an amount of power required to pre-charge the MIO lines of data terminal region LDQ may be reduced.

For at least these reasons, various embodiments of the present disclosure, as described more fully herein, provide a technical solution to one or more problems that arise from technology that could not reasonably be performed by a person, and various embodiments disclosed herein are rooted in computer technology in order to overcome the problems and/or challenges described above. Further, at least some embodiments disclosed herein may improve computer-related technology by allowing computer performance of a function not previously performable by a computer.

Figure 4:
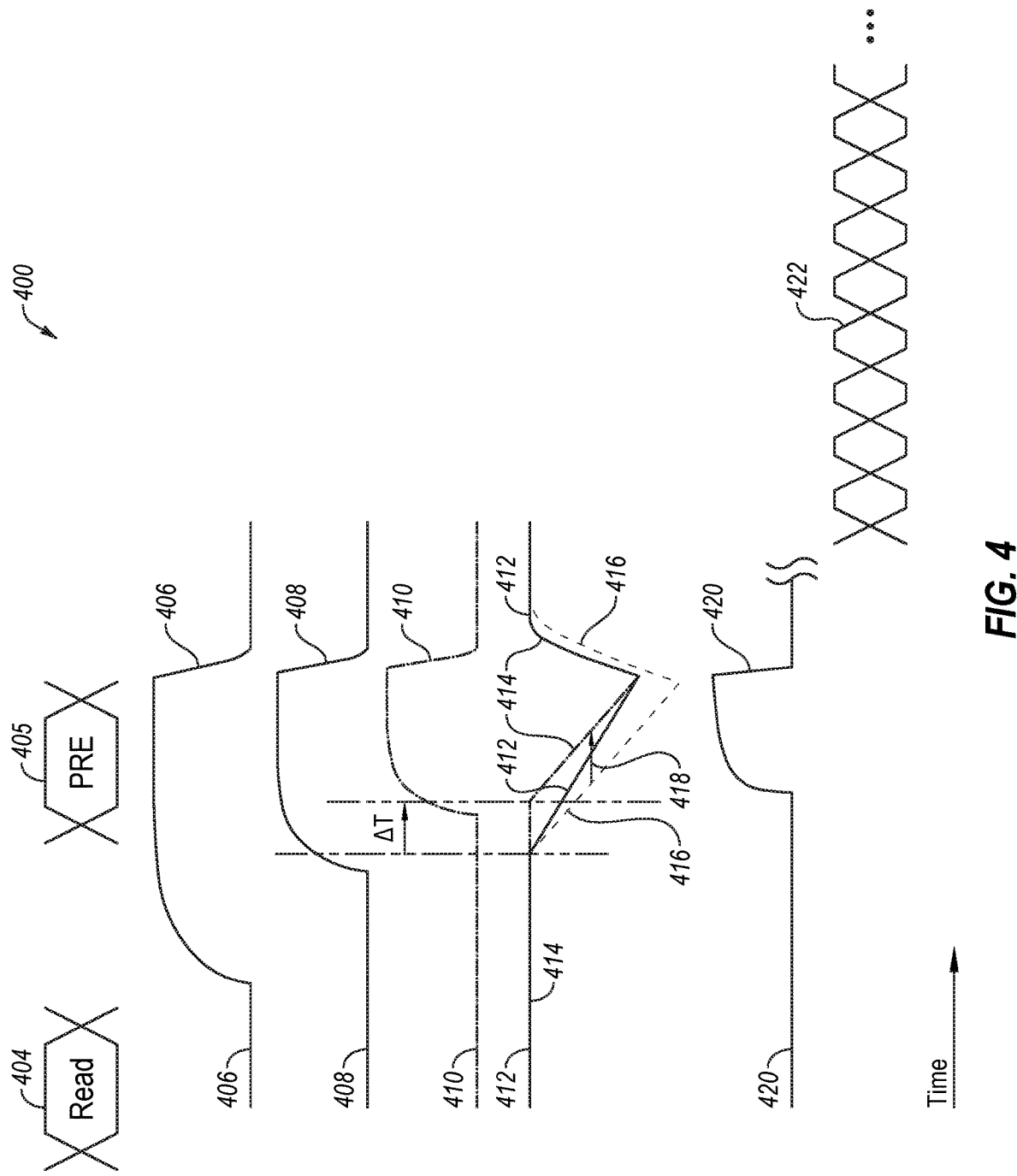
FIG. 4 shows a timing diagram including various signals associated with a memory device, according to various embodiments of the present disclosure.

FIG. 4 shows a timing diagram 400, according to various embodiments of the present disclosure. Timing diagram 400 depicts a Read command 404 and a PRE command 405. Further, timing diagram 400 depicts a column select signal 406, a first row select signal 408, and a second row select signal 410. For example, first row select signal 408 may be used to activate MIO lines (e.g., MIO 326 of FIG. 3B) of a first data terminal region (e.g., data terminal region UDQ of FIG. 3B), and second row select signal 410, which is delayed (e.g., by AT) relative to first row select signal 408, may be used to activate MIO lines (e.g., MIO 328 of FIG. 3B) of a second data terminal region (e.g., data terminal region LDQ of FIG. 3B). Timing diagram 400 further includes a digital sense amplifier enable signal 420 and a data signal 422.

Timing diagram 400 further includes a signal 412 indicative of a voltage on the MIO lines of the first data terminal region (e.g., data terminal region UDQ of FIG. 3B), a signal 414 indicative of a voltage on the MIO lines of the second data terminal region (e.g., data terminal region LDQ of FIG. 3B). Further, for comparison, a signal 416 represents a voltage on the MIO lines of the second data terminal region operating in accordance with a conventional method (i.e., without using a time delay, such that MIO lines of the first data terminal region and MIO lines for the second data terminal are activated at the same time). As shown in timing diagram 400, compared to conventional methods, various embodiments may enable the voltage on the MIO lines of the second data terminal to be reduced, as indicated by arrow 418.

According to at least embodiments, each of first row select signal 408 and second row select signal 410 may be generated in response to a READ command (e.g., Read command 404). Further, each of first row select signal 408 and second row select signal 410 may be reset based on PRE command (e.g., PRE command 405).

Figure 5:
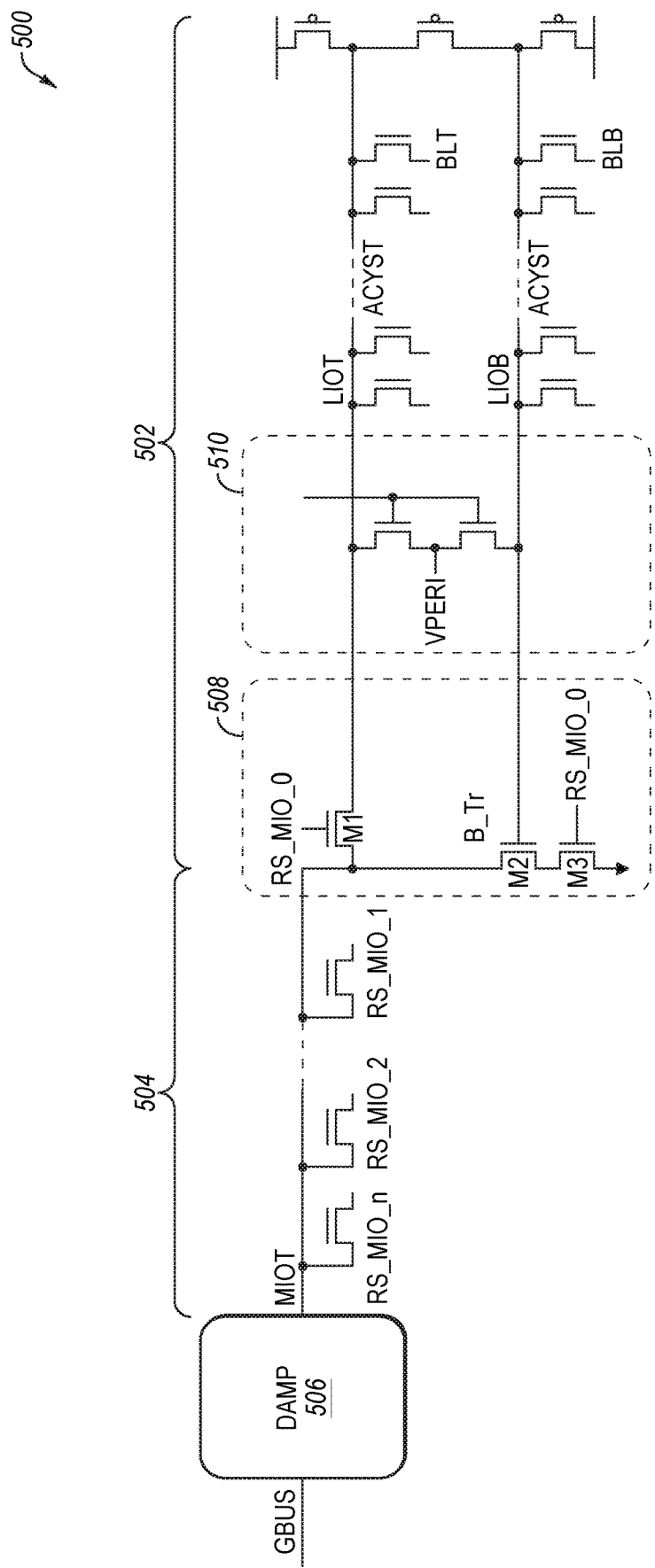
FIG. 5 illustrates a circuit including a sense amplifier, a transfer gate, and a main input/output, according to various embodiments of the present disclosure.

FIG. 5 illustrates a circuit 500, according to various embodiments of the present disclosure. Circuit 500 (also referred to herein as a "data path circuit"), which may be included within a memory device (e.g., memory device 300 of FIG. 3), includes a sense amplifier (SAMP) 502, a transfer gate (TG) 508, main input/output (MIO) 504, and a digital amplifier (DAMP) 506 coupled to a global bus (GBUS). For example, SAMP of FIG. 1 may include SAMP 502, the transfer gate TG of FIG. 1 may include a transfer gate TG 508 of circuit 500, and the MIO lines of FIG. 1 may include MIO 504. Circuit 500 also includes a switching element 510 including switches (e.g., transistors) configured for coupling local input/output lines (LIOT/LIOB) to a peripheral circuit power source VPERI.

Bit lines BLT and BLB, which are coupled to SAMP 502, may be selected via a column select signal ACYST (e.g., column select signal 406 of FIG. 4). Data read from bit line BLT or BLB may be amplified by sense amplifier SAMP 502, and transferred to global bus GBUS over complementary local input/output lines (LIOT/B), transfer gate TG 508, and main input/output lines MIOT. Conversely, write data may be transferred to SAMP 502 over main input/output lines MIOT, transfer gate TG, and complementary local input/output lines LIOT/B, and written in a memory cell (not shown in FIG. 5) coupled to bit line BLT or BLB.

Transfer gate 508 includes transistors M1-M3. Transistor M1 is coupled between LIOT and MIOT, and a gate of transistor M1 is configured to receive signal RS_MIO_0, which may include, for example, either row select signal 408 (see FIG. 4) or row select signal 410 (see FIG. 4), depending on which data terminal region is associated with circuit 500. More specifically, for example, if circuit 500 is associated with data terminal region UDQ of FIG. 3B, signal RS_MIO_0 may include row select signal 408 to activate MIOT. Further, if circuit 500 is associated with data terminal region LDQ of FIG. 3B, signal RS_MIO_0 may include row select signal 410 to activate MIOT.

Transistor M2 is coupled between MIOT and a transistor M3, which is further coupled to a reference (e.g., a ground). A gate of transistor M2 is coupled to LIOB, and a gate of transistor M3 is configured to receive signal RS_MIO_0. As will understood, when LIOT is HIGH, LIOB is LOW, transistor M2 is OFF, and a signal on LIOT is transferred to MIOT. Further, when LIOB is HIGH, transistor M1 may be OFF, and transistor M2 turns ON to transfer a signal on LIOB to MIOT.

Circuit 500 is provided as a non-limiting example data path between memory cells and GBUS, and other data path circuits may be used to carry out various embodiments of the disclosure. Further, although circuit 500 is shown as implementing a single ended MIO structure, other embodiments of the disclosure may include a differential MIO structure including complementary main input/output lines (MIOT/B).

Figure 6:
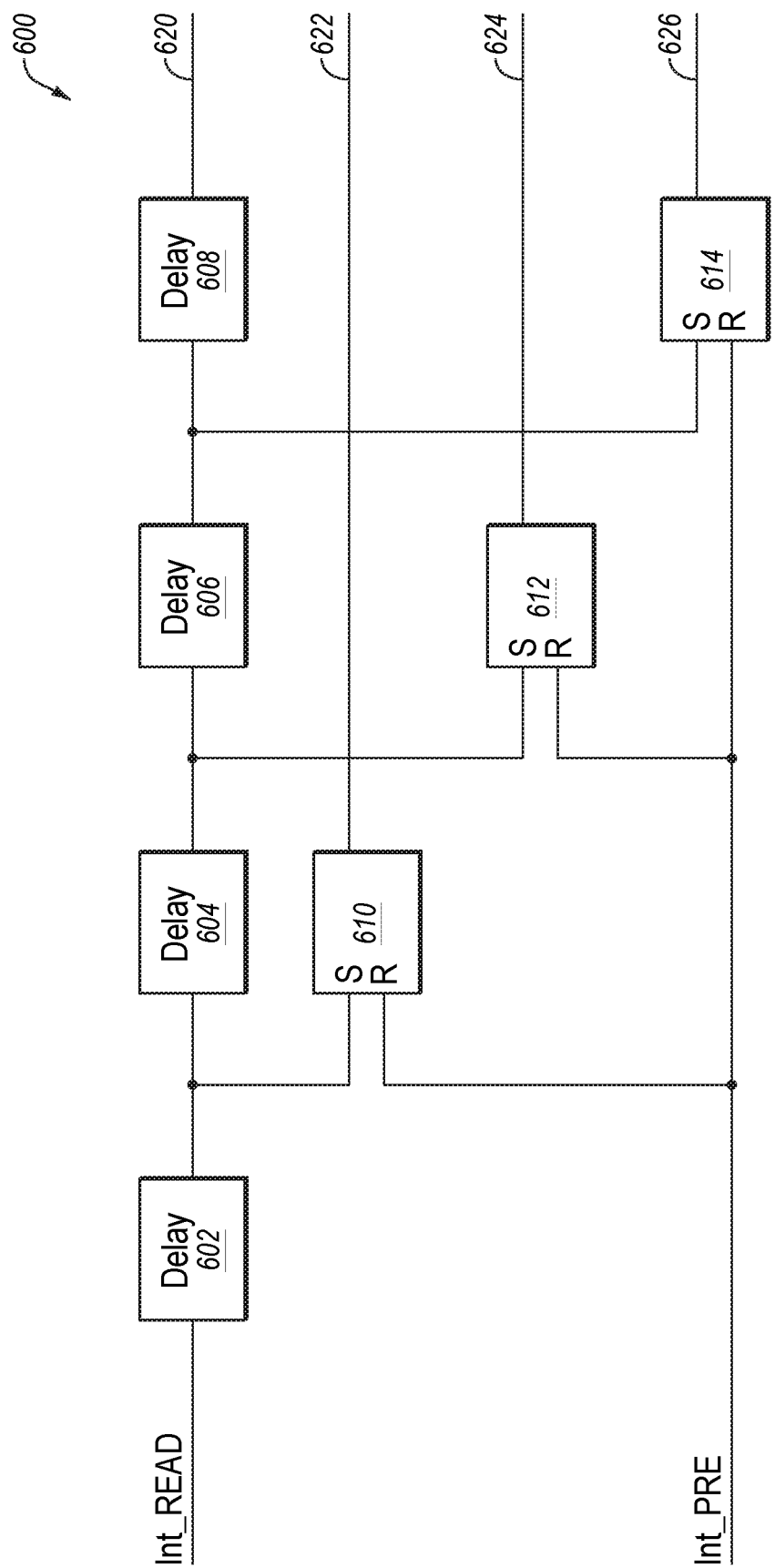
FIG. 6 depicts a signal generator, in accordance with various embodiments of the present disclosure.

FIG. 6 depicts a signal generator 600, according to one or more embodiments of the present disclosure. For example only, signal generator 109 of FIG. 1 may include signal generator 600. Signal generator 600, which includes a number of programmable delay elements 602, 604, 606, and 608, and a number of flip-flops 610, 612, and 614, is configured to generate various signal including two control signals that are offset in time. More specifically, signal generator 600, which includes a number of signal paths, may generate row select signal 408 and row select signal 410 (see FIG. 4), wherein row select signal 410 is delayed in time relative to row select signal 408.

More specifically, during a contemplated operation, signal generator 600 may receive a signal Int_READ or a signal Int_PRE. For example, signal Int_READ may be generated by a column decoder (e.g., column decoder 106 of FIG. 1) in response to a READ command, and signal Int_PRE may be generated by a column decoder (e.g., column decoder 106) in response to a PRE command. In some embodiments (e.g., wherein ECC is used), signal Int_READ may be generated by a column decoder (e.g., column decoder 106) in response to a WRITE command.

In response to receipt of signal Int_READ, signal Int_READ may propagate through delay element 602 to flip-flop 610, which may generate a column select signal 622 (e.g., column select signal 406 of FIG. 4). Further, signal Int_READ may propagate from an output of delay element 602 through delay element 604 to flip-flop 612, which may generate first row select signal 624 (e.g., row select signal 408 of FIG. 4). As will be appreciated, generation of first row select signal 624 may be delayed in time relative to column select signal 622 (i.e., due to delay element 604). Moreover, signal Int_READ may propagate from an output of delay element 604 through delay element 606 to flip-flop 614, which may generate a second row select signal 626 (e.g., row select signal 410 of FIG. 4). As will be appreciated, generation of second row select signal 626 may be delayed in time relative to first row select signal 624 (i.e., due to delay element 606). Furthermore, signal Int_READ may propagate from an output of delay element 606 through delay element 608, which may output a DSA signal 620. As will be appreciated, generation of DSA signal 620 may be delayed in time relative to second row select signal 626 (i.e., due to delay element 608). Moreover, in response to signal Int_PRE (e.g., generated in response to a PRE command), each of flip-flops 610, 612, and 614 may be reset, and thus column select signal 622, first row select signal 624, and second row select signal 626 may be reset.

Accordingly, as will be appreciated by a person having ordinary skill in the art, in response to a command (e.g., a READ or WRITE command), column select signal 622 may be enabled, and subsequently first row select signal 624 may be enabled. After first row select signal 624 is enabled, second row select signal 626 may be enabled. Further, after first row select signal 624 and second row select signal 626 are enabled, DSA signal 620 may be enabled. Additionally, in response to another command (e.g., PRE command), each of column select signal 622, first row select signal 624, and second row select signal 626 may be reset.

Signal generator 600 is provided as a non-limiting example signal generator, and other signal generators for generating control signals, in accordance with various embodiments of the disclosure, may within the scope of the present disclosure.

Figure 7:
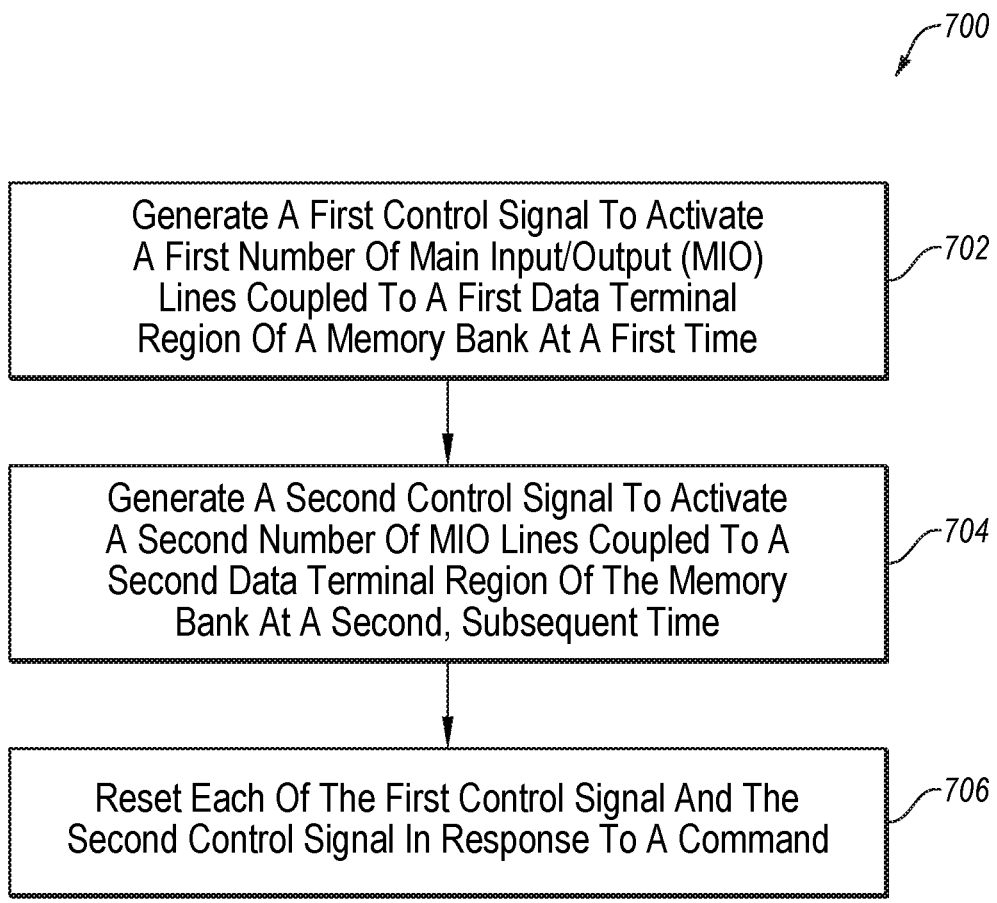
FIG. 7 is a flowchart of an example method of operating a memory device, in accordance with various embodiments of the present disclosure.

FIG. 7 is a flowchart of an example method 700 of operating a memory device, in accordance with various embodiments of the disclosure. Method 700 may be arranged in accordance with at least one embodiment described in the present disclosure. Method 700 may be performed, in some embodiments, by a device or system, such as memory device 100 of FIG. 1, memory device 200 of FIG. 2, memory device 300 of FIG. 3, circuit 500 of FIG. 5, signal generator 600 of FIG. 6, memory device 800 of FIG. 8, and/or system 900 of FIG. 9, or another device or system. Although illustrated as discrete blocks, various blocks may be divided into additional blocks, combined into fewer blocks, or eliminated, depending on the desired implementation.

Method 700 may begin at block 702, wherein a first control signal to activate a first number of MIO lines coupled to a first data terminal region of a memory bank at a first time is generated, and method 700 may proceed to block 704. For example, the first control signal, which may include row select signal 624 of FIG. 6, may be generated via signal generator 600 of FIG. 6. Further, the first control signal may be generated in response to a command, such as a READ command or a WRITE command associated with the memory bank. According to some embodiments, the first number of MIO lines may include MIO 326 of FIG. 3B, and the first data terminal region may include an upper data terminal region of a memory bank, such as data terminal region UDQ shown in FIG. 3B.

At block 704, a second control signal to activate a second number of MIO lines coupled to a second data terminal region of the memory bank at a second, subsequent time is generated, and method 700 may proceed to block 706. For example, the second control signal, which may include row select signal 624 of FIG. 6, may be generated via signal generator 600 of FIG. 6. Further, the second control signal may be generated in response to a command, such as a READ command or a WRITE command associated with the memory bank. According to some embodiments, the second number of MIO lines may include MIO 328 of FIG. 3B, and the second data terminal region may include a lower data terminal region of a memory bank, such as data terminal region LDQ shown in FIG. 3B.

At block 706, each of the first control signal and the second control signal may be reset. For example, each of the first control signal and the second control signal may be reset in response to a command, such as a PRE command. More specifically, for example, flip-flops 612 and 614 of signal generator 600 may be reset in response to signal Int_PRE, thus resetting each of the each of the first control signal and the second control signal.

Modifications, additions, or omissions may be made to method 700 without departing from the scope of the present disclosure. For example, the operations of method 700 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein each of the first control signal and the second control signal may be conveyed to a transfer gate, such as transfer gate TG shown in FIGS. 1 and 5. Further, a method may include activating, at the first time, the first number of MO lines of the memory bank, and activating, at the second, subsequent time, the second number of MIO lines of the memory bank. Moreover, in some embodiments, a method may include generating a column select signal prior to generating the first control signal and/or generating a DSA signal after generating the second control signal.

A memory device is also disclosed. According to various embodiments, the memory device may include one or more memory cell arrays, such as memory array 102 (see FIG. 1). The one or more memory cell arrays may include a number of memory cells.

FIG. 8 is a simplified block diagram of a memory device 800 implemented according to one or more embodiments described herein. Memory device 800, which may include, for example, a semiconductor device, includes a memory array 802 and a controller 804. Memory array 802, which may include a number of memory banks, may include a number of memory cells.

Controller 804 may be operatively coupled with memory array 802 so as to read, write, or refresh any or all memory cells within memory array 802. Controller 804 may be configured for carrying out one or more embodiments disclosed herein. For example, in some embodiments, controller 804, which may include, for example, signal generator 109 of FIG. 1 and/or signal generator 600 of FIG. 6, may be configured to generate one or more control signals (e.g., row select signals) for activating a number of MIO lines, in accordance with various embodiments disclosed herein.

A system is also disclosed. According to various embodiments, the system may include a memory device including a number of memory banks, each memory bank having an array of memory cells. Each memory cell may include an access transistor and a storage element operably coupled with the access transistor.

FIG. 9 is a simplified block diagram of an electronic system 900 implemented according to one or more embodiments described herein. Electronic system 900 includes at least one input device 902, which may include, for example, a keyboard, a mouse, or a touch screen. Electronic system 900 further includes at least one output device 904, such as a monitor, a touch screen, or a speaker. Input device 902 and output device 904 are not necessarily separable from one another. Electronic system 900 further includes a storage device 906. Input device 902, output device 904, and storage device 906 may be coupled to a processor 908. Electronic system 900 further includes a memory device 910 coupled to processor 908. Memory device 910, which may include memory device 800 of FIG. 8, may include an array of memory cells. Electronic system 900 may include, for example, a computing, processing, industrial, or consumer product. For example, without limitation, system 900 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Various embodiments of the present disclosure may include an apparatus. The apparatus may include a memory array including a number of memory banks. Each memory bank of the number of memory banks may include a first region coupled to a first number of main input/output (MIO) lines and a second region coupled to a second number of MIO lines. The apparatus may also include a signal generator coupled to the memory array. The signal generator may be configured to generate a first control signal that activates the first number of MIO lines at a first time. The signal generator may also be configured to generate a second control signal that activates the second number of MIO lines at a second, subsequent time.

One or more other embodiments of the present disclosure include a method of operating a memory device. The method may include generating a first control signal to activate a first number of main input/output (MIO) lines coupled to a first data terminal region of a memory bank at a first time. The method may also include generating a second control signal to activate a second number of MIO lines coupled to a second data terminal region of the memory bank at a second, subsequent time. The method may further include resetting each of the first control signal and the second control signal in response to a command.

Additional embodiments of the present disclosure include an electronic system. The electronic system may include at least one input device, at least one output device, and at least one processor device operably coupled to the input device and the output device. The electronic system may also include at least one memory device operably coupled to the at least one processor device and comprising a controller. The controller may be configured to activate, at a first time, a first number of main input/output (MIO) lines of a memory bank. The controller may also be configured to activate, at a second, subsequent time, a second number of MIO lines of the memory bank.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. An apparatus, comprising:
    a memory array including a number of memory banks, each memory bank of the number of memory banks comprising:
        a first region coupled to a first number of main input/output (MIO) lines of the memory bank, the first number of MIO lines each having a first length; and
        a second region coupled to a second number of MIO lines of the memory bank, the second number of MIO lines each having a second length shorter than the first length, the second number of MIO lines configured to be active during at least a portion of a time in which the first number of MIO lines are active; and
    a signal generator coupled to the memory array and configured to:
        generate a first control signal that activates the first number of MIO lines at a first time; and
        generate a second control signal that activates the second number of MIO lines at a second, subsequent time.

2. The apparatus of claim 1, wherein the signal generator is configured to generate each of the first control signal and the second control signal responsive to one of a READ command and a WRITE command.

3. The apparatus of claim 1, wherein the signal generator is further configured to reset each of the first control signal and the second control signal responsive to a precharge command.

4. The apparatus of claim 1, wherein the first region comprises an upper data terminal region and the second region comprises a lower data terminal region.

5. The apparatus of claim 1, wherein each memory bank of the number of memory banks further comprises a transfer gate configured to receive one of the first control signal and the second control signal.

6. The apparatus of claim 1, wherein the signal generator includes:
    a first path including a first delay element and a first flip-flop to generate the first control signal; and
    a second path including the first delay element, a second delay element, and a second flip-flop to generate the second control signal.

7. The apparatus of claim 1, wherein the signal generator is further configured to:
    generate a column select signal prior to generating the first control signal; and
    reset each of the column select signal, the first control signal, and the second control signal in response to receipt of a command signal.

8. A method of operating a memory device, comprising:
    generating a first control signal to activate a first number of main input/output (MIO) lines coupled to a first data terminal region of a memory bank at a first time;
    generating, while the first number of MIO lines are active, a second control signal to activate a second number of MIO lines coupled to a second data terminal region of the memory bank at a second, subsequent time, a length of each of the first number of MIO lines being greater than a length of each of the second number of MIO lines; and resetting each of the first control signal and the second control signal in response to a command.

9. The method of claim 8, wherein generating the first control signal comprises generating the first control signal responsive to one of a READ command and a WRITE command.

10. The method of claim 8, wherein generating the second control signal comprises generating the second control signal responsive to one of a READ command and a WRITE command.

11. The method of claim 8, wherein resetting each of the first control signal and the second control signal in response to the command comprises resetting each of the first control signal and the second control signal in response to a precharge (PRE) command.

12. The method of claim 8, further comprising:
activating the first number of MIO lines at the first time; and
activating the second number of MIO lines at the second, subsequent time.

13. The method of claim 8, further comprising:
generating a column select signal prior to generating the first control signal; and
generating a digital sense amplifier (DSA) signal after generating the second control signal.

14. An electronic system comprising:
at least one input device;
at least one output device;
at least one processor device operably coupled to the input device and the output device; and
at least one memory device operably coupled to the at least one processor device and comprising:
a controller, the controller configured to:
activate, at a first time, a first number of main input/output (MIO) lines of a memory bank; and
activate, at a second, subsequent time and while the first number of MIO lines are active, a second number of MIO lines of the memory bank, each of the first number of MIO lines having a length greater than a length of each of the second number of MIO lines, and each of the first number of MIO lines being independent of each of the second number of MIO lines.

15. The electronic system of claim 14, wherein the first number of MIO lines are associated with a first data terminal region of the memory bank and the second number of MIO lines are associated with a second, different data terminal region of the memory bank.

16. The electronic system of claim 14, wherein the controller is configured to:
generate a first control signal to activate the first number of MIO lines; and
generate a second, different control signal to activate the second number of MIO lines.

17. The electronic system of claim 16, wherein the controller is further configured to:
generate a column select signal prior to generating the first control signal; and
generate a data sense amplifier signal after generating the second, different control signal.

18. The electronic system of claim 14, wherein the controller includes a signal generator comprising a number of delay elements.

* * * * *

UNITED STATES PATENT AND TRADEMARK OFFICE
CERTIFICATE OF CORRECTION

PATENT NO. : 11,462,261 B2
APPLICATION NO. : 16/598938
DATED : October 4, 2022
INVENTOR(S) : Yosuke Takano and Atsushi Shimizu It is certified that error appears in the above-identified patent and that said Letters Patent is hereby corrected as shown below:

In the Specification
    Column 6, Line 24, change "by AT)" to --by $\Delta$T)--
    Column 9, Line 31, change "of MO lines" to --of MIO lines--

In the Claims
Claim 14, Column 14, Lines 2-3, after --and-- move --comprising:-- up to end of line Signed and Sealed this
Twenty-eighth Day of February, 2023

Katherine Kelly Vidal
*Director of the United States Patent and Trademark Office*